United States Patent
Najda

[19]
[11] Patent Number: 6,137,819
[45] Date of Patent: *Oct. 24, 2000

[54] OPTOELECTRONIC SEMICONDUCTOR DEVICE

[75] Inventor: Stephen Peter Najda, Oxford, United Kingdom

[73] Assignee: Sharp Kabushiki Kaisha, Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/815,387

[22] Filed: Mar. 11, 1997

[30] Foreign Application Priority Data

Mar. 13, 1996 [GB] United Kingdom ................... 9605288

[51] Int. Cl.⁷ ...................................................... H01S 3/085
[52] U.S. Cl. ................................................ 372/96; 372/45
[58] Field of Search ................................. 372/96, 50, 45

[56] References Cited

U.S. PATENT DOCUMENTS

| | | |
|---|---|---|
| 5,044,736 | 9/1991 | Jaskie et al. . |
| 5,069,820 | 12/1991 | Jen et al. . |
| 5,331,654 | 7/1994 | Jewell et al. ................................ 372/45 |
| 5,539,759 | 7/1996 | Chang-Hasnain et al. ................ 372/92 |

FOREIGN PATENT DOCUMENTS

| | | |
|---|---|---|
| 0473362 | 3/1992 | European Pat. Off. . |
| WO9222911 | 12/1992 | WIPO . |

OTHER PUBLICATIONS

E.F. Schubert et al., "Resonant Cavity Light–Emitting Diode", Applied Physics Letters, vol. 60, No. 8, pp. 921–932, 1992 (Feb).

H. Sugawara et al., "High–Brightness InGaAlP Green Light– Emitting Diodes", Applied Physics Letters, vol. 61, No. 15, pp. 1775–1777, 1992 (Oct.).

R.F. Kopf et al., "N–and P–Type Dopant Profiles In Distributed Bragg Reflector Structures And Their Effect On Resistance", Applied Physics Letters, vol. 61, No. 15, pp. 1820–1822, 1992 (Oct.).

J.L. Jewell et al., "Vertical–Cavity Surface–Emitting Lasers: Design, Growth, Fabrication, Characterization", *IEEE Journal of Quantum Electronics*, vol. 27, No. 6, pp. 1332–1346, 1991, (Jun.).

R.P. Schneider, Jr. et al., "InAlP/InAlGaP Distributed Bragg Reflectors For Visible Vertical Cavity Surface–Emitting Lasers", Applied Physics Letters, vol. 62, No. 22, pp. 2748–2750, 1993 (May).

K. Tai et al., "Continuous Wave Visible InGaP/InGaIP Quantum Well Surface Emitting Laser Diodes", *Electronics Letters*, vol. 29, No. 15, pp. 1314–1316, 1993 (Jul.).

M. Sugimoto et al., "Very Low Threshold Current Density In Vertical–Cavity Surface–Emitting Laser Diodes With Periodically Doped Distributed Bragg Reflectors", Electronics Letters, vol. 28, No. 4, pp. 385–387, 1992 (Feb.).

P.A. Morton et al., "Design Of 1.3–$\mu$m GaInAsP Surface–Emitting Lasers For High–Bandwidth Operation", *Optics Letters*, vol. 15, No. 12, pp. 679–681, 1990 (Jun.).

D.G. Deppe et al., "Room–Temperature Photopumped Operation Of An InGaAs–InP Vertical Cavity Surface–Emitting Laser", Applied Physics Letters, vol. 56, No. 22, pp. 2172–2174, 1990 (May).

(List continued on next page.)

*Primary Examiner*—James W. Davie
*Attorney, Agent, or Firm*—Renner, Otto, Boisselle & Sklar, LLP

[57] ABSTRACT

A laser or light emitting diode device has a p-i-n structure and a distributed Bragg reflector having layers alternating with other layers of different refractive indices. These layers are formed of p-type conducting polymer materials which are electrically conducting polymer materials which are electrically conducting and transparent at the emission wavelength of the device.

14 Claims, 3 Drawing Sheets

OTHER PUBLICATIONS

Y. Cao et al., "Solution–Cast Films Of Polyaniline: Optical–Quality Transparent Electrodes", *Applied Physics Letters,* vol. 60, No. 22, pp. 2711–2713, 1992 (Jun.).

M.S. Paley et al., "Photodeposition Of Thin Polydiacetylene Films From Solution That Exhibit Large Third–Order Optical Nonlinearities", Chem. Mater., No. 6, pp. 2213–2215, 1994 (no month available).

M.S. Paley et al., "Synthesis, Vapor Growth, Polymerization, and Characterization Of Thin Films Of Novel Diacetylene Derivatives Of Pyrrole", J. Am. Chem. Soc., No. 114, pp. 3247–3251, 1992. (no month available).

N. Takada et al., "Control Of Emission Characteristics In Organic Thin–Film Electroluminescent Diodes Using An Optical–Microcavity Structure", Applied Physics Letters, vol. 63, No. 15, pp. 2032–2034, 1993 (Oct.).

W. Masselink et al., "In0.35Ga0.65P Light–Emitting Diodes Grown By Gas–Source Molecular Beam Epitaxy", *Applied Physics Letters,* vol. 61, No. 1, pp. 58–60, 1992 (Jul.).

N.Matsumoto et al., "New Tri–Layer Resist System And Two–Step Developing Method For Nanometric T–Shaped Gate Lithography By A Thermal–Field–Emission, Electron-beam Machine", *The 7th International Workshop on Future Electron Devices,* pp. 181, 1989 (no month available).

D. Braun et al., "Visible Light Emission From Semiconducting Polymer Diodes", *Applied Physics Letters,* vol. 58, No. 18, pp. 1982–1984, 1991 (May).

Tocci et al., "Thin–film Nonlinear Optical Diode", Applied Physics Letters, vol.66, No. 18, pp. 2324–2326, May 1, 1995.

Search Report for European Patent Application No. 97301627.2–2214, mailed Jul. 8, 1997.

OPTOELECTRONIC SEMICONDUCTOR DEVICE

The present invention relates to optoelectronic semiconductor devices incorporating a distributed Bragg reflector (DBR), eg lasers such as vertical cavity surface emitting lasers (VCSELs), and light emitting diodes such as resonant cavity light emitting diodes (RCLEDs).

A major factor affecting the light output efficiency of VCSELs and RCLEDs is the series resistance of the distributed Bragg reflectors (DBRs), which inhibits carrier injection into an optical active region of the device. DBRs are made up of a multiplicity of transparent layers in which alternating layers of different refractive index are formed generally by epitaxial growth and carriers can be injected through the DBR and into the optically active region.

A RCLED structure comprises an active region located in a resonant optical cavity. An example of this structure is a $n^+$ GaAs substrate on top of which are formed a lower n-type semiconductor AlAs/$Al_xGa_{1-x}As$ DBR, a n-type confinement region, an active region, a p-type confinement region and a top reflector formed of Ag films covered by transparent conductor cadmium tin oxide layers. Such a structure is disclosed in Applied Physics Letters 60 (8), pages 921–923 (1992). However, the above DBR mirror is not practical for wavelengths of light which are in the visible range of the electromagnetic spectrum, since the band gaps of these materials are too small.

Wider band gap materials, such as AlGaInP/GaInP, can be used to fabricate DBR mirrors in devices emitting wavelengths of light in the range corresponding to infra-red through to green light. An example of a surface-emitting LED structure using wider band gap materials comprises an InGaAlP layer grown on a mis-orientated GaAs substrate in order to achieve improved emission properties. A single n-doped distributed Bragg reflector formed from InGaAlP layers is located between the substrate and an active region. Such a structure emits light in the visible range of the electromagnetic spectrum corresponding to green coloured light and is taught in Applied Physics Letters 61 (15), page 1775–1777 (1992).

However, the difference in the refractive index between mirror layers for phosphide doped semiconductor DBR mirrors becomes smaller for shorter wavelength mirrors, thus the number of layers of the mirror has to be increased in order to achieve the required reflectivity. Consequently, the series resistance of the semiconductor DBR mirror is increased. For phosphide doped semiconductor DBR mirrors, the maximum obtainable difference in refractive indices between adjacent mirror layers is in the region of 8%. The refractive index difference between adjacent mirror layers in arsenide doped semiconductor DBR mirrors is larger (up to 14%), but such DBR mirrors are inefficient as reflectors of light in the visible range of the electromagnetic spectrum.

The use of dopants in order to lower the series resistance of p-type semiconductor DBR mirrors has also been suggested in Applied Physics Letters 61 (15), pages 1820–1822 (1992), IEEE Journal of Quantum Electronics Volume 27, No. 6, pages 1332–1346 (1991) and Applied Physics Letters 62 (22), pages 2748–2750 (1993). However, impurity segregation during the growth of the layers of the mirror gives rise to fluctuations in series resistance over the area of the mirror.

One example of a VCSEL structure having semiconductor DBR mirrors comprises a plurality of quantum wells disposed between a lower n-type semiconductor DBR and an upper p-type semiconductor DBR by the Metal Oxide Chemical Vapour Deposition (MOCVD) technique. The DBRs consist of $Al_{0.5}Ga_{0.5}As/Al_{0.75}Ga_{0.25}As/AlAs/Al_{0.75}Ga_{0.25}As$ layers. The intermediate $Al_{0.75}Ga_{0.25}As$ layers are provided in order to lower the series resistance of the p-type DBR. The p-type semiconductor DBR is also doped with Zn in order to reduce its series resistance. Such a structure is described in Electronics Letters Vol. 29, No. 15, pages 1314–1316 (1993). However, although the series resistance is reduced, the series resistance is not reduced to an optimum level.

Another VCSEL structure for reducing the series resistance, whilst maintaining a low optical absorption uses periodically doped semiconductor DBRs. An example of one such device is disclosed in Electronic Letters Vol. 28, No. 4, pages 385–387 (1992).

For all of the above known structures, an attempt has been made to achieve shorter emission wavelengths and improved overall performance of the laser devices (e.g., increased quantum efficiency and lower threshold current). In the case of the above-described devices which have p-type semiconductor DBR mirrors, the high series resistance of such mirrors inhibits hole injection into the optical active region of the respective laser devices. The high series resistance also causes heating of the device and the additional voltage drop across the mirror degrades the device threshold current considerably for VCSEL structures and increases the "turn-on") voltage for RCLED structures. Further, the problems caused by the high series resistance of these p-type DBR mirrors is compounded when shorter wavelengths (eg green light) are involved since they require a greater number of mirror layers.

The use of dielectric mirror stacks has also been proposed as a way of overcoming the problem of high series resistances in DBR mirrors. Examples of such use are disclosed in Optics Letters, Vol. 15, 1990, pages 679–681 and Applied Physics Letters, Vol. 56, 1990, pages 2172–2174. However, current has to be injected around the insulating dielectric film, thereby increasing the fabrication difficulty. Further, the thermal expansion coefficients of the dielectric materials and the semiconductor materials are usually different and so give rise to thermal strain problems. Examples of such devices are also disclosed in EP-A-0473362, wherein, in order to increase the difference in refractive index between alternating electrically insulating DBR mirror layers and thereby enable the number of such layers to be decreased, an alternating layer structure is epitaxially grown and then alternate layers are etched away and back-filled with a material which has a significantly different refractive index to the remaining unetched layers. The back-filling material may be a thermosetting resin such as an epoxy resin, an organosiloxane polymer or an acrylic resin.

It is therefore an object of the present invention to obvlate or mitigate the problem caused by the high series resistance of known DBRs.

In accordance with a first aspect of the present invention, there is provided an optoelectronic semiconductor device comprising an optical active region and an electrically conductive distributed Bragg reflector, wherein the distributed Bragg reflector is at least partly formed from a polymer material which is electrically conductive.

Preferably, the distributed Bragg reflector comprises a first electrically conductive layer and a second electrically conductive layer, the refractive index of the first layer being different from the refractive index of the second layer, wherein at least the first layer is formed from a polymer material which is electrically conductive.

In accordance with a second aspect of the present invention, there is provided a distributed Bragg reflector having a first electrically conductive layer and a second electrically conductive layer, the refractive index of the first layer being different from the refractive index of the second layer, wherein at least the first layer is formed from a polymer material which is electrically conductive.

More preferably, the distributed Bragg reflector is formed substantially completely of layers of polymer materials which are electrically conductive.

By forming the electrically conductive distributive Bragg reflector from polymer material which is electrically conductive, it is possible to reduce the series resistance of the reflector and so increase the carrier injection into the active region of the device in comparison to the use of semiconductor layers for the reflector. Thus, the light output efficiency of the device can be improved. Advantageously, the bulk resistivity of the polymer material is 1 Ωcm or lower, and is preferably in the range of about 0.1 to 1 Ωcm.

Preferably, the difference between the refractive indices of adjacent layers of the distributed Bragg reflector is as large as possible (preferably greater than 8%, more preferably approximately 17%) at the emission wavelength of the device. Polymer materials can have differences in refractive indices greater than that of suitable semiconductor materials. An advantage of this feature is that fewer layers of the polymer material are required to form the distributed Bragg reflector because a greater variation in refractive indices can be achieved with these polymer materials than with conventionally used semiconductor materials.

Preferably, the optical transmittance of the polymer material is as high as possible at the emission wavelength of the device in which the distributed Bragg reflector is used. More preferably, the optical transmittance of the polymer material is greater than 70%.

The polymer material may include orientated polymer molecules such that the polymer material is a polariser. Orientation may be produced by stretching of the polymer material.

Thus, in accordance with a further aspect of the present invention, there is provided a method of producing a polarising distributed Bragg reflector comprising the steps of forming a multilayer structure of alternating layers of electrically conducting polymeric materials of different refractive indices, and stretching the multilayer structure to orientate polymer molecules in the polymeric materials.

The polymer material may be or include an intrinsically conductive polymer (ICP). Typically, ICPs are complexes wherein conductivity arises as a result of charge transfer along the polymer backbone. An example of such an ICP is a form of polyaniline which has been doped or complexed with an organic acid such as an organic sulphonic acid to form a polyaniline salt. U.S. Pat. No. 5,069,820, the disclosure of which is incorporated herein by reference, gives examples of such doped polyanilines. A commercially available ICP of this type is sold by AlliedSignal Inc of Buffalo, New York State, USA under the Registered Trade Mark VERSICON. Thus, the polymer material may be or include an electrically conductive polymer or copolymer salt. Instead of being based on polyaniline, the conductive polymer or copolymer salt may be based on other polymers or copolymers such as polytrifluorochloroethylene, α-naphthylpoly(meth)acrylate, polyvinyl naphthalene and trifluoroisopropyl(meth)acrylate. Other electrically conductive polymeric compositions containing electrically conductive polyaniline are disclosed in WO92/22911.

The matrix may be formed of a mixture or blend of polymers or copolymers. For example, the above-mentioned doped polymer or copolymer may be mixed or blended with an additional polymer or copolymer, eg a polymer selected from one or more of vinyl resins (eg PVC), (meth)acrylic resins (eg PMMA), polycarbonate resins, polyamide resins (eg nylon), polyethyleneterephthalate resins (eg PETG), epoxy resins, polyurethane resins and polyester resins. Such additional polymer or copolymer may be included in an amount of, for example, about 5% by weight of the total weight of the polymer material. The use of these polymer blends can enable the refractive index of the polymer material to be selected as desired.

In a convenient embodiment, the first layer of the distributed Bragg reflector has a matrix comprising or consisting of vinyl naphthalene and the second layer has a matrix comprising or consisting of trifluoroisopropyl methacrylate. In such an embodiment, each matrix may be doped with an organic acid radical, eg a sulphonate radical, or other species which imparts electrical conductivity to the matrix, or each matrix may be blended with an electrically conductive polymer or copolymer, such as polyaniline, doped with an organic acid radical.

Other, preferred, features are set forth in the accompanying claims.

The use of doped polyaniline as electrodes for liquid crystal displays and as transparent conductive coatings for anti-static applications is disclosed in Applied Physics Letters 60 (22), page 2711–2713 (1992) where the use of polyaniline as the hole injecting electrode of a flexible LED is also mentioned. Doped polyaniline has also been proposed in the above-mentioned U.S. Pat. No. 5,069,820 for a variety of uses including conductive polymer coated-housings for sensitive electronic equipment, infrared and microwave absorbing shields, flexible electrical conducting connectors, conductive bearings, brushes, semiconducting photoconductor junctions, antistatic materials for packaging electronic components, carpet fibres, waxes for floors in computer rooms and thin optically transparent antistatic finishes for CRT screens, aircraft and auto windows. However, as far as we are aware, the use of electrically conductive materials has never previously been proposed for forming the layers of a distributed Bragg reflector. The work function of conducting polyaniline materials can be as high as 4.4 eV. This is comparable with gold, which has a work function of 4.3 eV. Therefore, good electrical contact can be made by evaporating gold onto the conducting polymer material.

The polymer material layers of the distributed Bragg reflector may be produced by a spin-casting technique. Preferably, the spin-casting technique is performed using solutions of the pre-formed conducting polymer materials. The thin-film thickness and surface conductivity of the conducting polymer material can be changed by varying the spin-speed during the casting process.

The invention will now be described in more detail, by way of example, with reference to the accompanying drawings, in which.

Figures 1, 2:
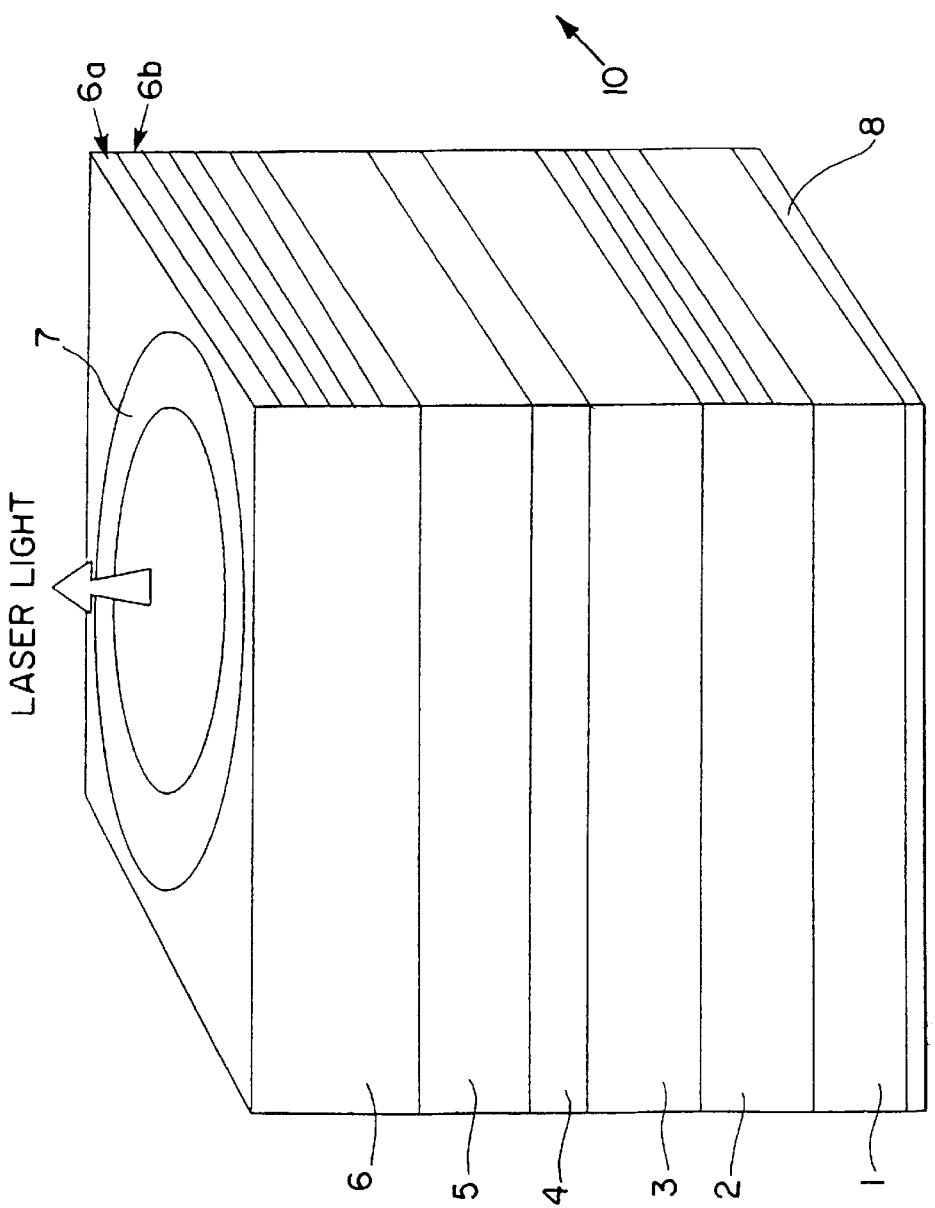
FIG. 1 is a schematic diagram of one embodiment of VCSEL according to the present invention.
FIG. 2 is a schematic diagram of another embodiment of optoelectronic semiconductor light emitting device in accordance with the present invention.

The VCSEL shown in FIG. 1 comprises an n-type semiconductor DBR mirror 2 formed on the upper surface of an n⁺ substrate 1. A p-i-n structure 3, 4, 5 is located on top of the n-type semiconductor DBR mirror 2. The p-i-n structure 3, 4, 5 consists of an optical active intrinsic region 4 sandwiched between an n-type semiconductor layer 3 and a p-type semiconductor layer 5. A p-type polymer DBR mirror 6 is formed on top of the p-i-n structure 3, 4, 5. The p-i-n structure 3, 4, 5 and the mirrors 2 and 6 together define a microcavity. An n-type contact 8 is formed on the lower surface of the n⁺ substrate 1 and a p-type ring contact 7 is formed on the upper surface of the p-type polymer DBR mirror 6.

The p-type polymer DBR mirror 6 is formed of first layers 6a of a first transparent conducting polymer material alternating with second layers 6b of a second transparent conducting polymer material. The refractive index of the first polymer material is different from the refractive index of the second polymer material. The reflectivity of the p-type polymer DBR mirror 6 is determined by the number of layers in the stack and the difference in refractive indices between each layer of the stack.

In this embodiment, the VCSEL is designed to emit at a wavelength $\lambda$ of 641 nm. The p-type DBR mirror 6 is formed of 25 layers (12.5 periods) in which the first layers 6a are formed of polytrifluorochloroethylene doped with an organic sulphonate radical, and the second layers 6b are formed of α-naphthylmethacrylate doped with an organic sulphonate radical. The first layers 6a have a refractive index $n_1=1.43$, and a bulk resistivity of 0.1–1 $\Omega$cm. The second layers 6b have a refractive index $n_2=1.641$, and a bulk resistivity of 0.1–1 $\Omega$cm. The optical active region 4 is a 5/2 $\lambda$ thick GaInP active region. The regions 3 and 5 are formed of AlGaInP. The n-type semiconductor DBR mirror 2 is a 25 layer (12.5 period) stack is formed of alternating, $\lambda/4$ thick layers of AlInP and $(Al_{0.3}Ga_{0.7})InP$, although alternating layers of AlGaP and GaInP can be used.

Figure 3:
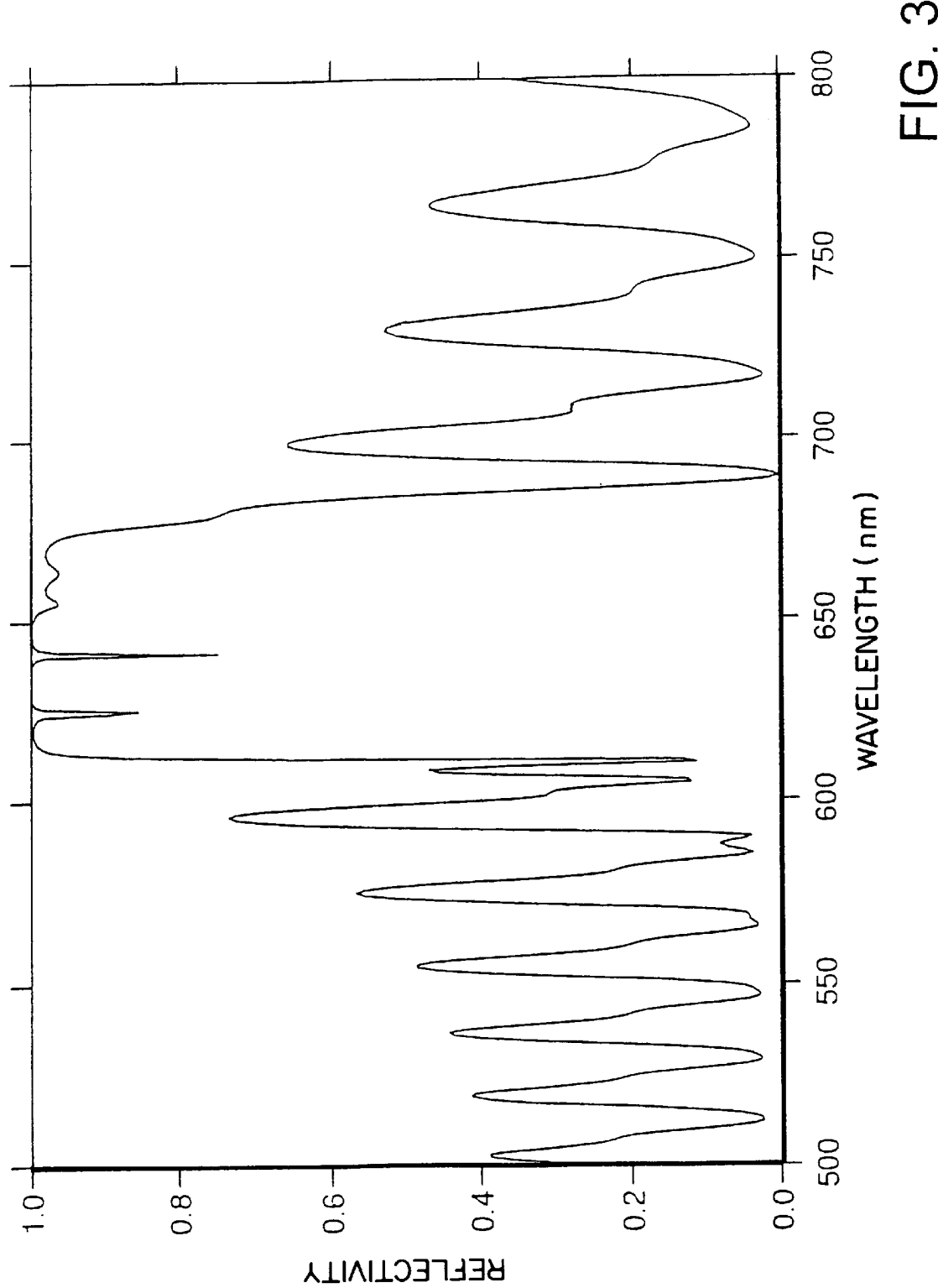
FIG. 3 is a graph showing the reflectivity characteristics of a microcavity forming part of the VCSEL of FIG. 1.

It can be seen from the reflectivity characteristics of FIG. 3, that a "notch" appears in the reflectivity characteristic at 641 nm corresponding to the emission wavelength $\lambda$ of the microcavity.

In order to form the semiconductor device of FIG. 1, the n-type semiconductor DBR mirror 2, the n-type semiconductor layer 3, the optical active intrinsic region 4 and the p-type semiconductor layer 5 are grown on the n⁺ substrate 1 by any desired technique, such as Molecular Beam Epitaxy (MBE) or Vapour Phase Epitaxy (VPE).

The p-type polymer DBR mirror 6 is then formed on top of the p-type semiconductor layer 5 by a spin-casting technique using a solvent solution of the electrically conducting polymer materials. In this embodiment, the layers 6a are formed using a solution of the above-described doped polytrifluorochloroethylene in a solvent of toluene, whilst the layers 6b are formed using a solution of the above-described doped α-naphthylmethacrylate in a solvent of toluene. Although toluene is used as the solvent above, other solvents may be used, eg acetone. The type and concentration of solvent used depends upon the desired viscosity of the electrically conducting polymer materials for forming the layers of the polymer DBR mirror 6 during spin-casting. The thickness of each layer 6a, 6b corresponds to $\lambda/4$, where $\lambda$ is the emission wavelength of the device.

The reflectivity characteristic of the p-type polymer DBR mirror 6 is determined by: the number of alternating polymer stack layers 6a, 6b, the difference in refractive indices between each adjacent layer 6a, 6b and the thickness of each layer 6a, 6b. It is possible to control the thickness of each layer of the polymer material 6a, 6b by varying the spin-speed and viscosity of the polymer solution during the spin casting process.

High quality polymer thin-films can also be grown to a high precision by photodeposition techniques, or chemical vapour techniques. Examples of such techniques are disclosed in Chemical Matters 6, 2713 (1994) and the Journal of American Chemical Society, Vol. 114, No. 9, pages 3247–3251 (1992).

In another example of the present invention, a DBR mirror is separately formed of layers of conducting polymer materials and then "stretched", so as to orientate the polymer molecules by a similar process to that used to stretch dichroic plastics to obtain a sheet which is linearly polarised. The resultant sheet is then bonded to the p-i-n structure 3, 4, 5. The polarisation degree can be controlled by control of the stretching operation.

Referring to FIG. 2, a semiconductor structure 10 is shown comprising an n⁺ substrate 11, a lower semiconductor DBR mirror 12, an n-type layer 13, an optical active, intrinsic region 14 and a p-type layer 15. The "stretched" p-type polymer material is thermally bonded to the semiconductor structure 10 to form an upper p-type polymer polarizing DBR mirror 9, thereby to form a Fabry-Perot microcavity between and including the upper p-type polymer polarizing DBR mirror 9 and the lower semiconductor DBR mirror 12. The active region 14 of the Fabry-Perot cavity has an anti-node in the optical field.

After thermally bonding the upper DBR mirror 9 onto the semiconductor structure 10, upper and lower contacts (not shown in FIG. 2) are respectively formed in a manner known per se on the upper surface of the upper DBR mirror 9 and the undersurface of the substrate 11.

As in the case of the previous example, the Fabry-Perot cavity has a "notch" in its reflectivity characteristic allowing only linearly polarised light to escape at the wavelength corresponding to the "notch". The top p-type polymer polarizing DBR mirror 9 reflects light of other polarizations.

An advantage of the top p-type polymer polarizing DBR mirror 9 is that it forms an integral part of the micro cavity and so reduces losses because it ensures the direct feedback of the reflected light into the micro cavity.

Figure 4:
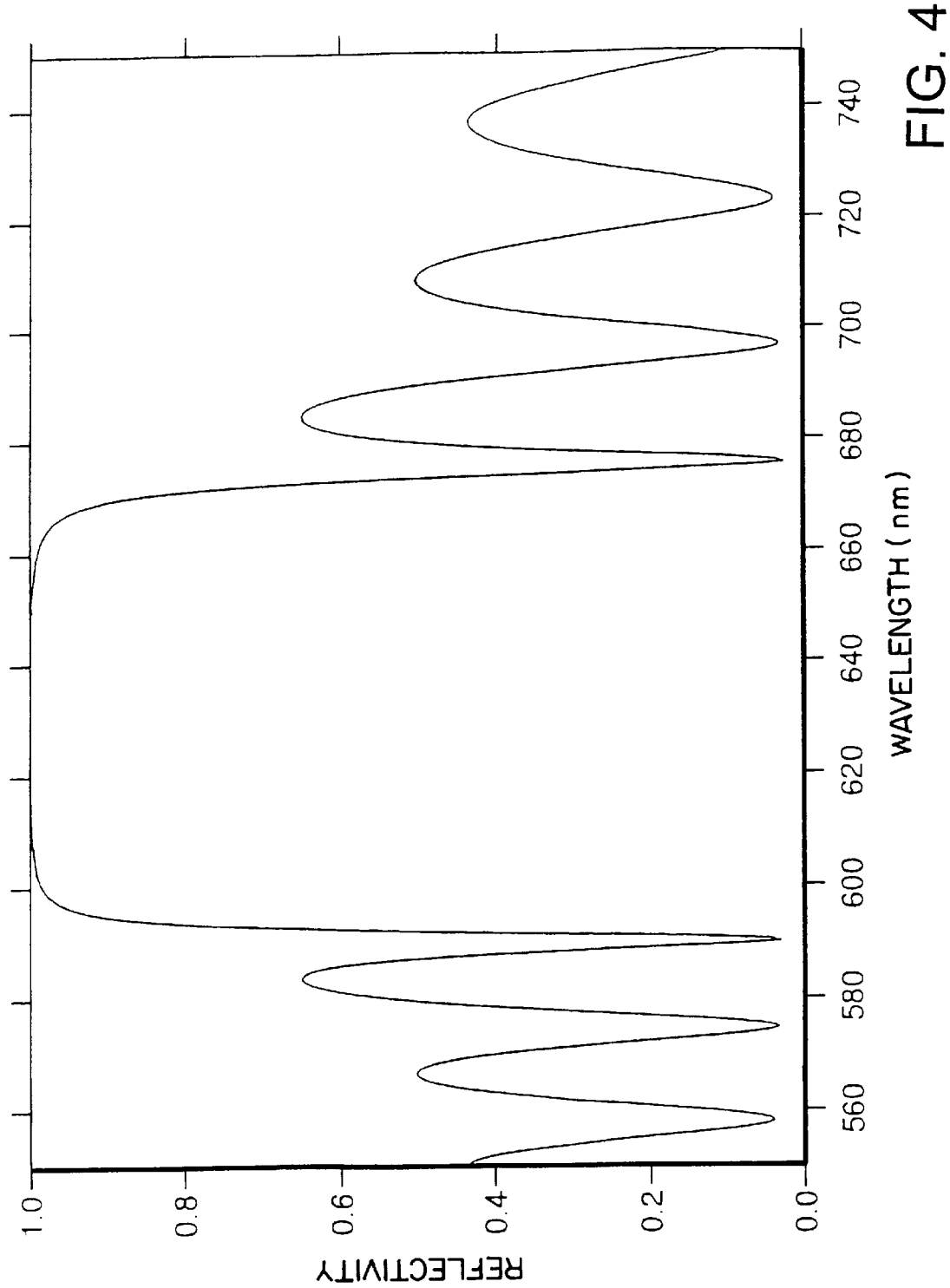
FIG. 4 is a graph showing the reflectivity characteristics of a DBR mirror fabricated according to the present invention.

In another embodiment of the present invention, a 28 layer (14 period) p-type polymer DBR mirror is formed by any of the above mentioned techniques. The p-type polymer DBR mirror comprises alternating layers of vinyl naphthalene doped with an organic sulphonate radical and trifluoroisopropyl methacrylate doped with an organic sulphonate radical. The reflectivity characteristics are shown in FIG. 4. At 630 nm, the reflectivity of the mirror is greater than or equal to 99.9%.

Due to the greater difference in refractive indices between layers of these polymer DBR mirrors, it is possible to achieve a 99.9% reflectivity with fewer periods than with wide band gap materials, such as AlGaP/GaInP. Thus, there is on average, about 2–3 orders of magnitude improvement in the series resistance of a p-type DBR mirror using polymer materials compared with a p-type DBR mirror fabricated from semiconductor materials.

On account of their low series resistance, polymer DBR mirrors provide improved hole injection into the optical active region of a device whilst retaining the reflective properties of the mirror. Thus, optical efficiency is improved, lower thresholds achieved and device heating of vertical cavity light emitting structures is reduced.

It is not intended to restrict the scope of the present invention to the class of optoelectronic devices comprising phosphide semiconductor materials. It is conceivable to construct VCSELs and RCLEDs from wide band gap nitride or II-VI group semiconductor materials, the bank gaps of these materials being larger than the band gaps of phosphide semiconductor materials. Typically, the band gaps of nitride or II-VI group semiconductor materials correspond to wavelengths of light in the blue to ultra-violet range of wavelengths. Since nitride and II-VI group semiconductor materials are difficult to dope p-type (only relatively low doping levels have been achieved, typically p~$10^{17}$–$10^{18}$ cm$^{-3}$), the use of low resistance p-type polymer DBRs provides a convenient way of fabricating VCSELs or RCLEDs comprising nitride or II-VI group semiconductor materials.

Thus, VCSELs and RCLEDs formed from nitride or II-VI group semiconductor materials and having a polymer p-type DBR mirror avoid the need to p-dope the semiconductor DBR. Furthermore, the overall thickness of a short wavelength polymer DBR mirror becomes thinner, since the thickness of each layer in the DBR corresponds to $\lambda/4$. For example, the thickness (and series resistance) of a DBR suitable for use with wavelengths of light corresponding to blue light is—30% less than the thickness of a DBR suitable for use with wavelengths of light corresponding to red light. The performance of short wavelength optoelectronic devices is therefore improved.

Further, the present invention is not limited to a p-type polymer mirror/semiconductor configuration. The invention also contemplates all-polymer optoelectronic devices having both n- and p-type polymer DBR mirrors and polymer p-n or p-i-n regions, e.g. an El polymer microcavity (for example, of the type described in Applied Physics Letters 58 (18), page 1982 (1991) or Applied Physics Letters 63 (15), page 2032 (1993)).

What is claimed is:

1. An optoelectronic semiconductor device, comprising:
    an optical active region
    a first electrically conductive Bragg reflector; and
    a second electrically conductive Bragg reflector,
    wherein the first Bragg reflector is a polymer Bragg reflector which includes layers of different polymer materials and at least one of the polymer layers is formed from an electrically conductive polymer material and the second Bragg reflector is a semiconductor Bragg reflector.

2. A device according to claim 1, wherein the first Bragg reflector comprises:
    a first electrically conductive layer; and
    a second electrically conductive layer having a refractive index which is different from that of the first electrically conductive layer,
    wherein at least the first electrically conductive layer is formed from the polymer material which is electrically conductive.

3. A device according to claim 2, wherein the first Bragg reflector comprises a multiplicity of the first electrically conductive layers alternating with a multiplicity of the second electrically conductive layers, and all of the first and second electrically conductive layers are formed of different electrically conductive polymer materials.

4. A device according to claim 1, wherein the electrically conductive polymer material comprises a non-conducting matrix doped with a carrier.

5. A device according to claim 1, wherein the electrically conductive polymer material comprises a blend of a non-conducting polymer and an additional polymer, the non-conducting polymer being doped with a carrier.

6. A device according to claim 5, wherein the additional polymer is selected from the group consisting of vinyl resins, acrylic resins, polycarbonate resins, polyamide resins, polyethyleneterephthalate resins, epoxy resins, polyurethane resins, and polyester resins.

7. A device according to claim 6, wherein the acrylic resins include methacrylic resins.

8. A device according to claim 1, wherein a bulk resistivity of the electrically conductive polymer material is about 1 $\Omega$cm or lower.

9. A device according to claim 1, wherein the electrically conductive polymer material includes oriented polymer molecules such that the polymer material is a polarizer.

10. A device according to claim 1, which is a light emitting device.

11. A device according to claim 10, wherein the light emitting device is a laser.

12. A device according to claim 11, wherein the laser is a VCSEL.

13. A device according to claim 1, wherein the first electrically conductive Bragg reflector is an electrically conductive n-type Bragg reflector and the second electrically conductive Bragg reflector is an electrically conductive p-type Bragg reflector, and wherein an optical active region is positioned between the first electrically conductive n-type Bragg reflector and the second electrically conductive p-type Bragg reflector.

14. An optoelectronic semiconductor device, comprising:
    an optical active region;
    a first electrically conductive Bragg reflector, comprising
        a multiplicity of first electrically conductive layers, and
        a multiplicity of second electrically conductive layers alternating with the multiplicity of first electrically conductive layers, the second electrically conductive layers having a refractive index which is different from that of the first electrically conductive layers; and
    a second electrically conductive Bragg reflector,
    wherein the first electrically conductive Bragg reflector is a polymer Bragg reflector and the second Bragg reflector is a semiconductor Bragg reflector, and
    wherein the first electrically conductive layers and the second electrically conductive layers of the first Bragg reflector are formed of different electrically conductive polymer materials.

* * * * *